(12) United States Patent
Oberst et al.

(10) Patent No.: US 12,247,310 B2
(45) Date of Patent: Mar. 11, 2025

(54) LIPSEAL EDGE EXCLUSION ENGINEERING TO MAINTAIN MATERIAL INTEGRITY AT WAFER EDGE

(71) Applicant: Lam Research Corporation, Fremont, CA (US)

(72) Inventors: Justin Oberst, Beaverton, OR (US); Bryan L. Buckalew, Tualatin, OR (US); Kari Thorkelsson, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 218 days.

(21) Appl. No.: 17/997,170

(22) PCT Filed: Apr. 7, 2021

(86) PCT No.: PCT/US2021/026248
§ 371 (c)(1),
(2) Date: Oct. 26, 2022

(87) PCT Pub. No.: WO2021/221872
PCT Pub. Date: Nov. 4, 2021

(65) Prior Publication Data
US 2023/0167571 A1  Jun. 1, 2023

Related U.S. Application Data

(60) Provisional application No. 63/018,365, filed on Apr. 30, 2020.

(51) Int. Cl.
*C25D 17/00* (2006.01)
*C25D 5/02* (2006.01)
(Continued)

(52) U.S. Cl.
CPC ............ *C25D 17/004* (2013.01); *C25D 5/022* (2013.01); *C25D 5/12* (2013.01); *C25D 7/123* (2013.01);
(Continued)

(58) Field of Classification Search
None
See application file for complete search history.

(56) References Cited

U.S. PATENT DOCUMENTS 9,752,248 B2 * 9/2017 Kagajwala ........... C25D 17/002
2004/0166789 A1   8/2004 Ashjaee et al.
(Continued)

FOREIGN PATENT DOCUMENTS

CN  102459717 A  5/2012
CN  102953104 A  3/2013
(Continued)

OTHER PUBLICATIONS

International Preliminary Report on Patentability dated Nov. 10, 2022, in PCT Application No. PCT/US2021/026248.
(Continued)

*Primary Examiner* — Louis J Rufo
(74) *Attorney, Agent, or Firm* — Weaver Austin Villeneuve & Sampson LLP

(57) ABSTRACT

Sequential electrodeposition of metals into through-mask features on a semiconductor substrate is conducted such as to reduce the deleterious consequences of lipseal's pressure onto the mask material. In a first electroplating step, a first metal (e.g., nickel) is electrodeposited using a lipseal that has an innermost point of contact with the semiconductor substrate at a first distance from the edge of the substrate. In a second electroplating step, a second metal (e.g., tin) is electrodeposited using a lipseal that has an innermost point of contact with the semiconductor substrate at a greater
(Continued)

distance from the edge of the substrate than the first distance. This allows to at least partially shift the lipseal pressure from a point that could have been damaged during the first electrodeposition step and to shield from electrolyte any cracks that might have formed in the mask material during the first electroplating step.

20 Claims, 10 Drawing Sheets

(51) Int. Cl.
  *C25D 5/12* (2006.01)
  *C25D 7/12* (2006.01)
  *C25D 21/12* (2006.01)
  *H01L 21/288* (2006.01)
(52) U.S. Cl.
  CPC ........... *C25D 17/001* (2013.01); *C25D 21/12* (2013.01); *H01L 21/288* (2013.01)

(56) References Cited

U.S. PATENT DOCUMENTS

| | | | |
|---|---|---|---|
| 2007/0034526 A1 | 2/2007 | Makino et al. | |
| 2009/0280649 A1 | 11/2009 | Mayer et al. | |
| 2010/0155254 A1 | 6/2010 | Prabhakar et al. | |
| 2011/0203518 A1 | 8/2011 | Katsuoka et al. | |
| 2013/0042454 A1 | 2/2013 | Feng et al. | |
| 2013/0062197 A1* | 3/2013 | He | C25D 17/001 204/297.05 |
| 2013/0137242 A1 | 5/2013 | He et al. | |
| 2016/0115615 A1 | 4/2016 | He et al. | |
| 2016/0194780 A1* | 7/2016 | Nagai | C25D 17/06 204/242 |
| 2016/0201212 A1* | 7/2016 | Ostrowski | C25D 17/005 204/297.01 |
| 2017/0009369 A1 | 1/2017 | Berke et al. | |
| 2017/0073832 A1 | 3/2017 | Berke et al. | |
| 2017/0081775 A1 | 3/2017 | Kao et al. | |
| 2019/0040544 A1 | 2/2019 | Berke et al. | |
| 2022/0396894 A1 | 12/2022 | Kearns et al. | |

FOREIGN PATENT DOCUMENTS

| | | |
|---|---|---|
| CN | 105624754 A | 6/2016 |
| CN | 106337199 A | 1/2017 |
| CN | 106480481 A | 3/2017 |
| CN | 107012495 A | 8/2017 |
| CN | 107254702 A | 10/2017 |
| CN | 107419312 A | 12/2017 |
| JP | 2019123935 A | 7/2019 |
| KR | 101581276 B1 | 1/2016 |
| TW | 201407003 A | 2/2014 |
| WO | WO-0075977 A1 | 12/2000 |

OTHER PUBLICATIONS

International Preliminary Report on Patentability dated Apr. 14, 2022 in PCT Application PCT/US2020/053518.
International Search Report and Written Opinion dated Jan. 15, 2021 in PCT Application PCT/US2020/053518.
International Search Report and Written Opinion dated Jul. 27, 2021, in PCT Application No. PCT/US2021/026248.
CN Office Action dated Jan. 5, 2024 in CN Application No. 202080070051.5 with English Translation.
SG Search Report and Written Opinion dated Aug. 23, 2024 in SG Application No. 11202203157Q.
U.S. Notice of Allowance dated Oct. 30, 2024 in U.S. Appl. No. 17/754,345.
TW Office Action dated Nov. 12, 2024 in TW Application No. 110115031 with English translation.

* cited by examiner

LIPSEAL EDGE EXCLUSION ENGINEERING TO MAINTAIN MATERIAL INTEGRITY AT WAFER EDGE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD OF THE INVENTION

This invention pertains to methods and apparatuses for semiconductor device manufacturing. Specifically, embodiments of this invention pertain to electrodeposition of metals, particularly to through-mask electroplating.

BACKGROUND

Through-mask electroplating in semiconductor device fabrication involves electrodeposition of metals into recessed features that have an exposed conductive layer at the bottom portions of the recessed features. The sidewalls of the recessed features and the field region in these substrates are made of a non-conductive mask material, such as photoresist. During electroplating, the semiconductor substrate is cathodically biased by making an electrical contact to the conductive layer that underlies the mask material and by applying a negative voltage from a power supply to that layer. The contact is typically made at the periphery of the semiconductor substrate in the substrate holder assembly.

The substrate holder also typically includes a cup holding the semiconductor substrate and an elastomeric lipseal, which seals the outer edge and backside of the wafer substrate from an electrolyte. During electroplating the cathodically biased substrate is brought into contact with an electrolyte, which causes electrochemical reduction of ions contained in the electrolyte upon contact with the cathodically biased metal on the semiconductor substrate. In some applications, such is in wafer level packaging (WLP) two metals such as tin and silver are electroplated using an electrolyte containing tin and silver ions. The formed tin-silver (SnAg) bumps can then be used for soldering several substrates together.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods and apparatuses for sequential electrodeposition of metals into through-mask recessed features on semiconductor substrates are provided. Provided methods can be used to reduce deleterious consequences of mask material damage during sequential electroplating.

In one aspect, a method of electrodepositing a metal onto a semiconductor substrate having a plurality of through-mask recessed features, is provided. The method includes: (a) electrodepositing a first metal into the recessed through-mask features of the semiconductor substrate, without fully filling the recessed through-mask features, in a first electroplating cell using a first lipseal, wherein the first lipseal contacts the semiconductor substrate at a periphery of the semiconductor substrate, and wherein an innermost point of contact between the first lipseal and the semiconductor substrate is located at a first distance from an edge of the semiconductor substrate; and (b) electrodepositing a second metal into the recessed through-mask features of the semiconductor substrate after (a), in a second electroplating cell using a second lipseal, wherein the second lipseal contacts the semiconductor substrate at a periphery of the semiconductor substrate, wherein an innermost point of contact between the second lipseal and the semiconductor substrate is located at a second distance from the edge of the semiconductor substrate, and wherein the second distance is greater than the first distance. In some embodiments the mask material is a photoresist, and the first and second lipseals contact the photoresist material on the semiconductor substrate. In some embodiments electrodeposition of the second metal does not result in protrusion of the electrodeposited second metal above a level of a mask material.

In some embodiments, after the first metal has been electrodeposited, the method includes releasing the semiconductor substrate from contact with the first lipseal after, and leaving the semiconductor substrate without contact with a lipseal for a period of time (e.g., at least one hour) prior to electroplating the second metal.

The methods are particularly useful when deposition of the first metal is carried out in a warm electrolyte, because warm electrolyte is more likely to lead to damage of the mask material near the lipseal. In one embodiment the first metal is electrodeposited in a plating bath (electrolyte) having a temperature of greater than 25° C., such as greater than 40° C. In one specific implementation, the first metal is nickel, and the nickel is electrodeposited using a plating bath having a temperature of greater than 25° C., such as greater than 40° C.

In one embodiment, the first metal is nickel, and the second metal is tin or a combination of tin and silver. In some embodiments, the first metal is nickel, the second metal is tin or a combination of tin and silver, and the method additionally includes electrodepositing copper into the recessed through-mask features prior to electrodeposition of nickel.

In some embodiments, the first lipseal and the second lipseal are different lipseals, and the second lipseal has a smaller diameter than the first lipseal (referring to inner diameters of the lipseals).

In an alternative embodiment, the first lipseal and the second lipseal is the same lipseal that is configured to be adjusted to contact the substrate at different positions.

In one embodiment, the semiconductor substrate used during sequential deposition of metals is a partially fabricated high bandwidth memory (HBM) device.

In some embodiments provided methods further include the steps of: applying photoresist to the semiconductor substrate; exposing the photoresist to light; patterning the photoresist and transferring the pattern to the semiconductor substrate; and selectively removing the photoresist from the semiconductor substrate.

In another aspect, a system for electroplating a metal onto a semiconductor substrate is provided. The system includes: (a) a first electroplating apparatus configured for electrodepositing a first metal onto the semiconductor substrate, the first electroplating apparatus comprising a substrate holder having a first lipseal; (b) a second electroplating apparatus configured for electrodepositing a second metal onto the semiconductor substrate, the second electroplating apparatus comprising a substrate holder having a second lipseal, wherein the second lipseal has a smaller diameter than the first lipseal; and (c) a controller comprising program instructions. The program instructions are configured to cause the steps of: (i) electroplating the first metal in the first electrplating apparatus to partially fill through-mask recessed features on the semiconductor substrate; and (ii) electroplating the second metal in the second electroplating apparatus after the first metal has been electroplated.

In another aspect a system for electroplating a metal onto the semiconductor substrate is provided, where the system includes: (a) a first electroplating apparatus configured for electrodepositing a first metal onto the semiconductor substrate from a heated electrolyte, the first electroplating apparatus comprising a substrate holder having a first lipseal; and (b) a second electroplating apparatus configured for electrodepositing a second metal onto the semiconductor substrate from an unheated electrolyte, the second electroplating apparatus comprising a substrate holder having a second lipseal, wherein the second lipseal has a smaller diameter than the first lipseal.

Any of the apparatuses provided herein can include a controller having program instructions configured to cause any of the steps of the methods provided herein.

In another aspect, a non-transitory computer machine-readable media is provided, wherein the non-transitory computer machine-readable media includes a code configured to cause the steps of any of the methods provided herein.

These and other aspects of implementations of the subject matter described in this specification are set forth in the accompanying drawings and the description below.

DETAILED DESCRIPTION OF THE PREFERRED EMBODIMENTS

Figure 1A:
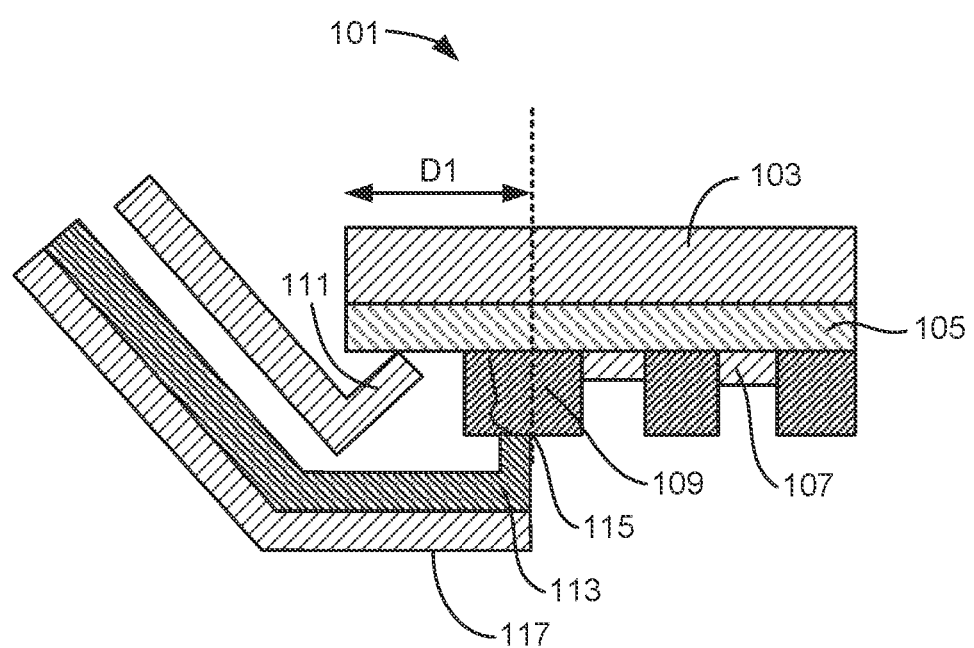
FIG. 1A provides a schematic cross-sectional view of a portion of a semiconductor substrate in a substrate holder during deposition of a first metal in through-mask recessed features according to an embodiment provided herein.

In some processes used in semiconductor device processing, sequential electrodeposition of several metals into through-mask recessed features on semiconductor substrate is employed. For example, in some processing methods that are used for manufacturing high bandwidth memory (HBM) devices, nickel is electrodeposited into the through-mask features followed by electrodeposition of tin or a tin silver combination into the same recessed features. The process typically involves securing the semiconductor substrate in a substrate holder and immersing the working surface of the semiconductor substrate into an electrolyte containing nickel ions, cathodically biasing the substrate, and electrodepositing nickel into the through mask features. When the semiconductor substrate is secured in the substrate holder, a lipseal presses onto the mask material on the periphery of the semiconductor substrate. After electrodeposition of nickel is completed, the substrate is released from the substrate holder, and is sometimes stored for a period of time (e.g., 1-24 hours), before electrodeposition of a second metal is started. After storage, the semiconductor substrate is placed into a substrate holder again, where a lipseal presses again onto the mask material at the periphery of the substrate. The substrate is then brought into contact with a second electrolyte (e.g., with an electrolyte containing $Sn^{2+}$ ions or a mixture of $Sn^{2+}$ and $Ag^+$ ions) and is cathodically biased to deposit a second metal (e.g., tin or tin-silver combination) into the through-mask recessed features.

One of the problems encountered during sequential electrodeposition of metals in through-mask (e.g., through-photoresist) features is inadvertent formation of cracks in the mask material during electrodeposition of a first metal, which may lead to defective plating at the periphery of the substrate during subsequent electrodeposition of a second metal. The cracks can form due to the compression of the mask material by the lipseal in the substrate holder, and by subsequent release of this compression after the substrate is removed from the substrate holder and is placed into storage before plating of a second metal. The cracking is exacerbated when warm or hot electrolytes are used during electrodeposition of the first metal. It was discovered that an electrolyte can permeate into the cracks during electrodeposition of the second metal, which may lead to unwanted electrodeposition of the second metal under the mask material with subsequent peeling or flaking of the mask material. These problems lead to non-uniformity of electrodeposition of the second metal.

Methods and apparatuses for preventing or minimizing defective electroplating of the second metal are provided. The methods and apparatuses are particularly useful for electroplating on semiconductor substrates, where the first electrodeposition is conducted at a high temperature (e.g., where electrolyte temperature in a first electrodeposition is greater than about 25° C., such as greater than about 30° C., or greater than about 40° C.) but are not limited to these applications. Provided methods can be used during fabrication of HBM memory, but are generally applicable to any process that utilizes sequential electrodeposition of metals into recessed features. The methods can be used for minimizing plating defects during electrodeposition of a variety of metals, but will be primarily illustrated with reference to sequential electrodeposition of nickel (Ni) followed by tin silver (SnAg).

The term "a metal" as used in the claims, refers to one or more metals, and "electrodeposition of a metal" is not limited to electrodeposition of a single metal. For example, "a metal" can be a combination of tin and silver. In some embodiments, the methods are used for electrodeposition of nickel (Ni) followed by electrodeposition of tin (Sn) as a single metal. In some embodiments, the methods are used for electrodeposition of copper (Cu), followed by electrodeposition of nickel (Ni), and followed by electrodeposition of tin (Sn) or tin silver (SnAg).

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates. The following detailed description assumes the disclosed implementations are implemented on a semiconductor wafer, such as on a 200 mm, 300 mm, or 450 mm semiconductor wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

The term "about" when used in reference to numerical values includes a range of ±10% of the recited numerical value, unless otherwise specified.

According to provided methods, sequential electrodeposition of metals into through-mask features on a semiconductor substrate is conducted such as to reduce the deleterious consequences of lipseal's pressure onto the mask material. In a first electroplating step, a first metal (e.g., nickel) is electrodeposited using a lipseal that has an innermost point of contact with the semiconductor substrate at a first distance from the edge of the substrate. In a second electroplating step, a second metal (e.g., tin silver) is electrodeposited using a lipseal that has an innermost point of contact with the semiconductor substrate at a greater distance from the edge of the substrate than the first distance. This sequence results in reduced pressure on at least some of the portions of the mask that may be damaged during deposition of the first metal, and can also shield these portions from electrolyte.

Figure 1B:
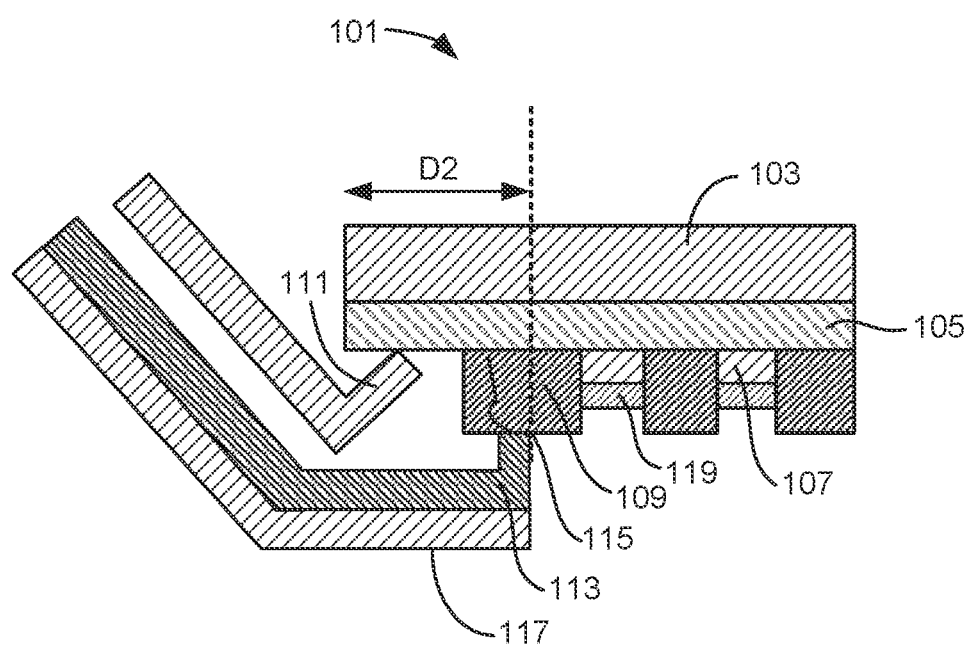
FIG. 1B provides a schematic cross-sectional view of a portion of a semiconductor substrate in a substrate holder during deposition of a second metal in an absence of lipseal edge exclusion engineering.
Figure 1C:
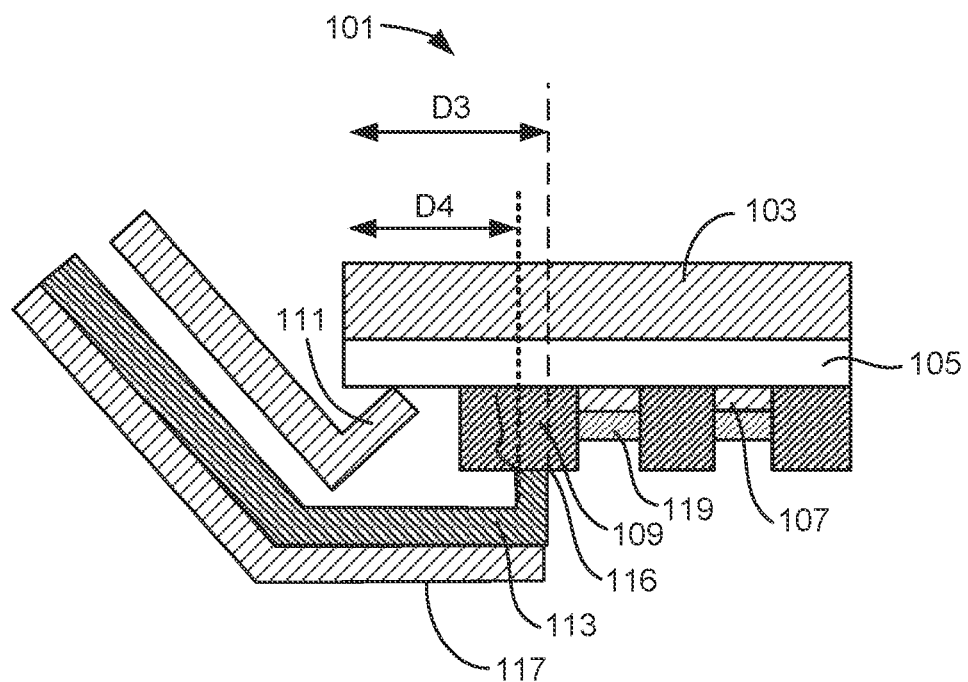
FIG. 1C provides a schematic cross-sectional view of a portion of a semiconductor substrate in a substrate holder during deposition of a second metal according to an embodiment provided herein.

The methods are illustrated by FIGS. 1A, 1B, and 1C which show schematic cross-sectional views of a peripheral portion of a semiconductor substrate in a substrate holder during electrodeposition of metals into through-mask features, where the substrate is held in a face-down orientation. FIG. 1A illustrates electrodeposition of a first metal (e.g., nickel) into through-mask features. The substrate 101 is typically a semiconductor wafer, which has a portion 103 (which may include a combination of semiconductor, dielectric and conductive layers), and a conductive seed layer 105 in direct contact with the portion 103. The conductive seed layer 105 can include a variety of metals, such as copper (including copper alloys), cobalt, ruthenium, etc. The seed layer at the periphery of the semiconductor substrate is used for making an electrical contact and for negatively biasing the substrate during electroplating. The first metal layer 107 (e.g., a nickel layer) is deposited into the recessed through-mask features which are formed by a patterned mask layer 109 (e.g., a photoresist layer) over the seed layer 105. Prior to electrodeposition of the first metal layer, the seed layer 105 was exposed to the electrolyte at the bottom portions of the through-mask recessed features. During electroplating of the first metal, the semiconductor substrate 101 is placed into the substrate holder such that an electrically conductive contact 111 (electrically connected to a power supply) contacts the seed layer 105 at the periphery of the substrate, and is configured to negatively bias the semiconductor substrate 101 during electroplating. The semiconductor substrate is pressed into a lipseal 113, where the innermost point of contact 115 of the lipseal 113 with the semiconductor substrate 101 is located at the periphery of the substrate, as illustrated at a distance D1 from the edge of the semiconductor substrate 101. The semiconductor substrate 101 is supported by a cup 117 of the substrate holder. The lipseal 113 is typically made of an elastomeric material and has an annular portion that presses onto the mask material 109 at the periphery of the substrate. It can be seen that due to the compression of the mask material 109, a crack is formed in the mask material 109 near the point of contact with the lipseal 133.

Figure 2:
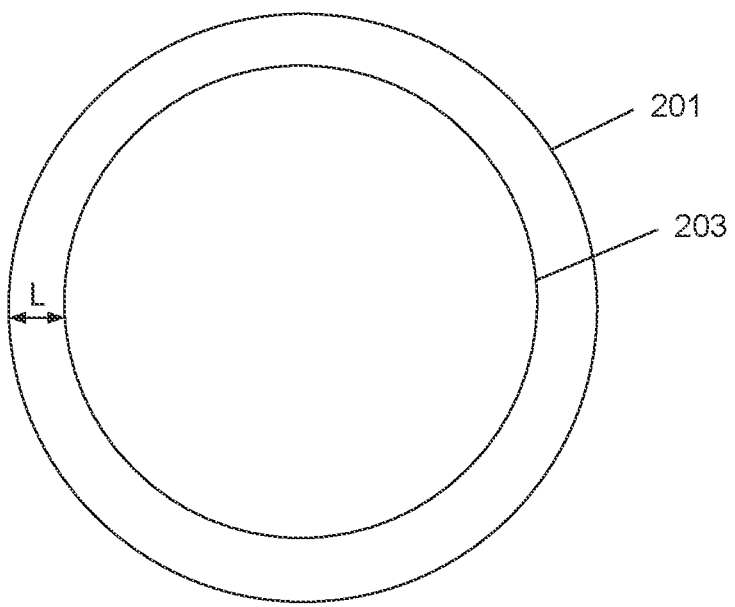
FIG. 2 is a schematic top view of annular portions of two lipseals having different diameters that can be used during electroplating according to embodiments provided herein.

If no action is taken to mitigate the consequences of the damage to the mask material, and without engineering of the edge exclusion zone (the zone from the edge of the substrate to the innermost point of contact of the substrate with the lipseal), a lipseal of the same diameter as the first lipseal is used during deposition of the second metal. For example, after electrodeposition of the first metal (as shown in FIG. 1A), the substrate is removed from the wafer holder, and, after optional storage, may be transferred to a second wafer holder that has an identical lipseal that presses onto the same positions of the mask material as the lipseal that was used during electroplating of the first metal. This is illustrated by FIG. 2A which shows a schematic cross-sectional view of an edge portion of the wafer substrate undergoing electrodeposition of a second metal over the first metal. The second metal 119 (e.g., tin silver) is deposited over the first metal 107 (e.g., nickel) while the substrate's working surface is immersed into an electrolyte containing ions of a second metal. In this case the distance D2 from the edge of the substrate to the innermost point of contact of the lipseal 133 with the substrate 101 is the same as distance D1 used during deposition of the first metal. This arrangement can lead to undesired electrodeposition of the second metal underneath the mask material, flaking of the mask material, and non-uniform electrodeposition of the second metal near the edge of the substrate.

In the embodiments provided herein, the edge exclusion zone is engineered such that during electrodeposition of the second metal the lipseal is configured such that there is a larger distance from the edge of the substrate to the innermost point of contact of the lipseal with the substrate than the distance from an edge of the substrate to the innermost point of contact of the lipseal that was used during the first metal electrodeposition. This can be accomplished, for example, by using a lipseal having a smaller diameter (referring to inner diameter of an annular portion of a lipseal that comes in contact with the substrate) than the lipseal that was used during electrodeposition of a first metal. This is illustrated by FIG. 1C, which shows a schematic partial cross-sectional view of an edge of a substrate undergoing electrodeposition of a second metal. In this implementation a lipseal 114 having a smaller diameter than the lipseal 113 shown in FIG. 1A is used. The distance D3 from the innermost point of contact 116 of the lipseal 114 with the wafer substrate 101 is greater than the distance D1 illustrated in FIG. 1A. In some embodiments the distance D4 from the edge of the wafer to the outer point of contact of the lipseal 114 with the substrate 101 is also larger than an equivalent distance from the edge of the wafer to the outer point of contact of the lipseal 113 and the substrate 101 used during electrodeposition of the first metal. By using a lipseal of a smaller diameter during electrodeposition of a second metal, the deleterious effects of cracks in the mask material and subsequent plating non-uniformity can be reduced or avoided.

In a specific implementation a lipseal used during electrodeposition of nickel (a first metal) has an innermost point of contact with the substrate at 2.25 mm from the edge of the substrate, and a lipseal used during electrodeposition of tin silver (a second meta) has an innermost point of contact with the substrate at 2.40 mm from the edge of the substrate.

In some embodiments the distance from the edge of the substrate to an innermost point of contact of a lipseal with the substrate during the electrodeposition of the second metal is greater than a distance from the edge of the substrate to an innermost point of contact of a lipseal with the substrate during the electrodeposition of the first metal by about 0.1-0.5 mm such as by about 0.15-0.25 mm. In other words, referring to FIGS. 1A and 1C, in some embodiments D3 minus D1 is about 0.1-0.5 mm such as about 0.15-0.25 mm. This can also be illustrated by FIG. 2, which shows a schematic top view of innermost diameters of two lipseals. The lipseal 201 is a larger-diameter lipseal that is used during electrodeposition of a first metal. The lipseal 203 is a smaller-diameter lipseal that is used during electrodeposition of a second metal. The difference of the radiuses of the two lipseals, L, is in some embodiments about 0.1-0.5 mm, such as about 0.15-0.25 mm, and corresponds to the difference of D3 and D1 described above with reference to cross-sectional views shown in FIGS. 1A and 1C.

Figure 3:
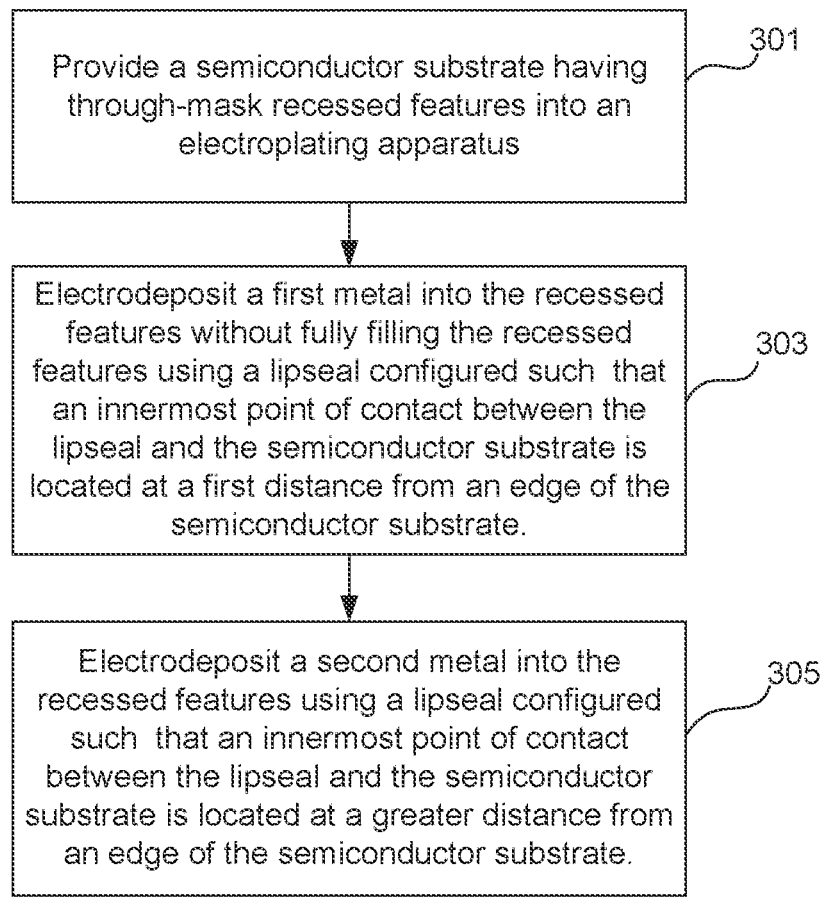
FIG. 3 is a process flow diagram for an electrodeposition method according to an embodiment provided herein.

FIG. 3 provides an exemplary process flow diagram for conducting electroplating using edge exclusion zone engineering in accordance with embodiments provided herein. The process starts in step 301 by providing a semiconductor substrate having through-mask recessed features to an electroplating apparatus. The substrate (e.g., a partially fabricated HBM device) is secured in a substrate holder having a lipseal that presses onto the mask material at the edge of the substrate, and is immersed into an electroplating solution configured for electroplating a metal into the through-resist recessed features. The electroplating solution contains ions of the metal that is being plated, and, optionally may contain an acid. In step 303, a first metal is electrodeposited into the recessed features without fully filling the recessed features, using a lipseal configured such that an innermost point of contact between the lipseal and the semiconductor substrate is located at a first distance from an edge of the semiconductor substrate. Next, in step 305, a second metal is electrodeposited into the recessed features using a lipseal configured such that an innermost point of contact between the lipseal and the semiconductor substrate is located at a greater distance from an edge of the semiconductor substrate. In some embodiments, electrodeposition of a first and second metals is performed using two different substrate holders, where the substrate holder used for electrodeposition of a first metal has a lipseal of a larger diameter than a lipseal used in electrodeposition of a second metal.

While in some embodiments the edge exclusion zone can be engineered by using lipseals of different diameters, in other embodiments, the same effect can be obtained by using a single lipseal that is configured to be modified using torque or compression.

Figure 4A:
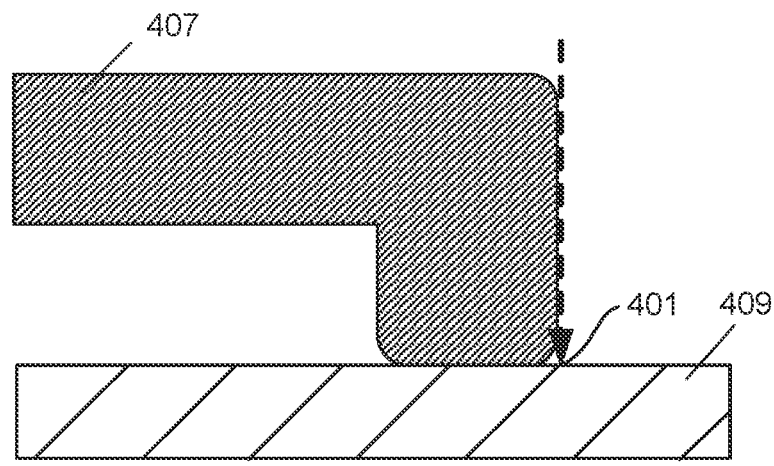
FIGS. 4A-4C show schematic cross-sectional views of a portion of modifiable lipseal that can be used in electrodeposition according to embodiments provided herein.
Figure 4B:
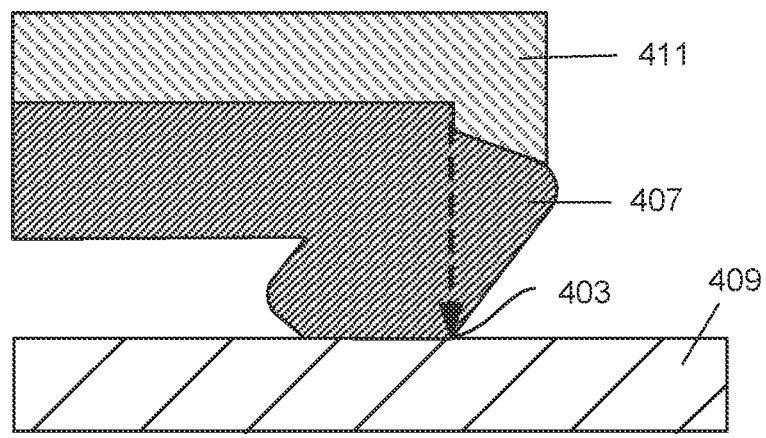
Figure 4C:
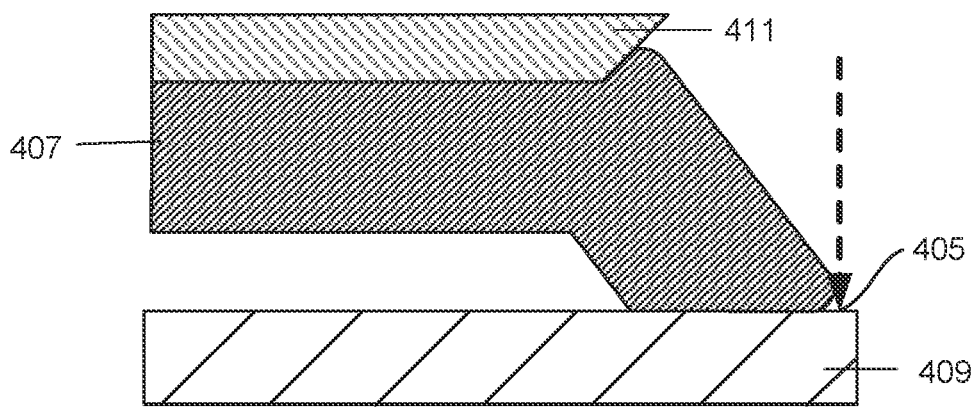

In some embodiments the lipseal is changed from a first configuration to a second configuration using torque. An example of such a lipseal 407 is illustrated in FIGS. 4A-4C, where the location of the innermost lipseal-wafer contact 401, 403, and 405 can be changed by using a torque on a cup 411 holding the substrate 409 between configuration of FIG. 4A, configuration of FIG. 4B, and configuration of FIG. 4C. For example, plating of a first metal can be conducted when the lipseal 407 is in position shown in FIG. 4A, where the lipseal 407 contacts the semiconductor substrate 409 at position 401 (referring to the innermost point of contact). Next, the substrate may be transferred to contact a different electrolyte, and the lipseal may be configured into a position shown in FIG. 4C using torque, such that the innermost point of contact 405 between the lipseal and the substrate is further inward from the edge of the wafer than the contact point 401 shown in FIG. 4A. A second metal can be electroplated in this configuration. Alternatively, the first metal can be electroplated in the configuration shown in FIG. 4B, where the innermost point of contact 403 between the lipseal and the substrate is closer to the edge of the substrate than in both the configuration shown in FIG. 4A and in FIG. 4C. After the first metal has been electroplated using the configuration shown in FIG. 4B, the substrate can be transferred to a second electrolyte and the lipeal configuration can be changed to one shown in FIG. 4A or FIG. 4C that both provide larger edge exclusion zone (distance from the edge of the substrate to the innermost point of contact between the lipseal and the substrate). Then, a second metal is electroplated into the recessed features using the lipseal configuration shown in FIG. 4A or FIG. 4C. Different steps may have variations in lipseal supporting hardware that drive different exclusion via torqueing the identical lipseals in different ways.

Figure 5A:
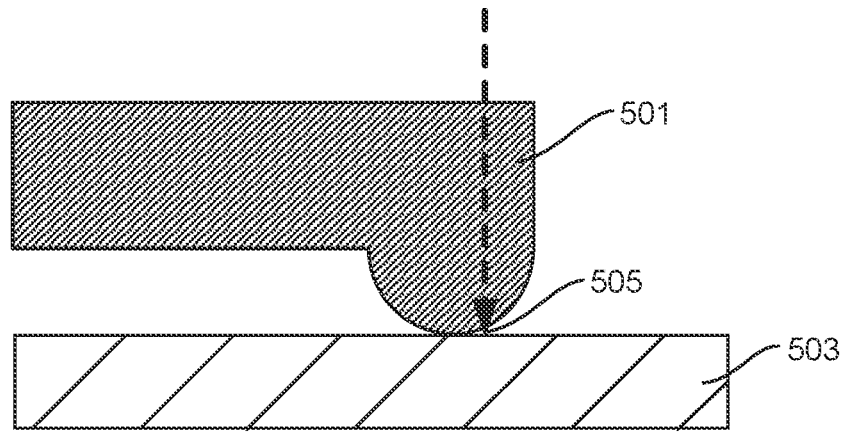
FIGS. 5A-5B show schematic cross-sectional views of a different modifiable lipseal that can be used in electrodeposition according to embodiments provided herein.
Figure 5B:
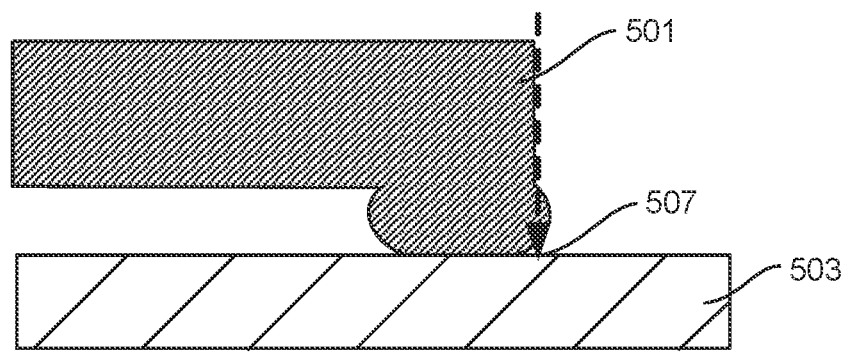

In some embodiments the lipseal is changed from a first configuration to a second configuration using compression. An example of such a lipseal is illustrated in FIGS. 5A-5B, where the point of lipseal-wafer contact can be changed by using cup compression force or contacts spring compression force. For example, plating of a first metal can be conducted when the lipseal 501 is in position shown in FIG. 5A (uncompressed state), and has an innermost point of contact with the substrate 503 at point 505. Next, the substrate can be transferred to a different electrolyte (without changing the lipseal) and the configuration of the lipseal 501 can be changed to a configuration shown in FIG. 6B (compressed), such that an innermost point of contact 507 of the lipseal 501 with the substrate 503 is further away from the edge of the substrate than in the configuration shown in FIG. 6A.

It is noted that the described methods are illustrated using sequential deposition of two metals as an example, but provided embodiments are not limited to electrodeposition of two metals, and can be used for sequential electrodeposition of a larger number of metals (e.g., 3, 4, or 5 metals), where the edge exclusion zone may be engineered during all or at least some steps. For example, if three metals are sequentially deposited, a lipseal used during deposition of a first metal may have larger diameter than a lipseal used during deposition of a second metal, which in turn may have a larger diameter than a lipseal used during deposition of a third metal. In another implementation, lipseals used during deposition of a first and second metal may have the same diameter, and a lipseal used during deposition of a third metal may have a smaller diameter than both of these lipseals. An example of sequential electrodeposition, where three metals are plated into through mask features includes sequential electrodeposition of copper followed by nickel followed by tin or tin silver.

Provided methods are particularly useful when electrodeposition of the first metal is conducted at an elevated temperature (e.g., at least about 25° C., such as at least about 30° C., or at least about 40° C.). This is because warm or hot electrolyte is capable of damaging the mask material (e.g., organic photoresist material) to a greater extent than cold electrolyte. Examples of metals that are often electroplated at elevated temperature include nickel and cobalt. In some embodiments the first metal is electrodeposited at an elevated temperature and the second metal is electrodeposited at room temperature.

In some embodiments provided methods are used for sequential electroplating of metals into through-mask features, where the electrodeposited metals are not formed above the field region defined by the plane of the photoresist. Such plating is used in some embodiments because it minimizes the risks of metal plating on a lipseal material.

Apparatus

The deposition methods described herein can be carried out in a variety of electroplating apparatuses. In some embodiments, electroplating of a first metal (e.g., nickel) is conducted in first electroplating apparatus having a first plating chamber and a first substrate holder with a first lipseal, and electroplating of a second metal is conducted in a second electroplating apparatus having a second plating chamber, and a second substrate holder with a second lipseal (e.g., a lipseal of a smaller diameter than the first lipseal).

A suitable apparatus for deposition of a first or second metal includes a plating chamber configured for holding an electrolyte and an anode, and a substrate holder having contacts for cathodically biasing the substrate, a cup for holding the substrate and a lipseal. Deposition can be conducted in a face-up or a face-down orientation. Some plating tools may be also run vertically. An example of a suitable apparatus is a SABRE 3D tool available from Lam Research Corp. of Fremont, CA In some embodiments the electroplating tool includes multiple plating cells (for electrodepositing identical or different metals) and a robotic tool for transferring the substrate between the individual plating cells.

Figure 6:
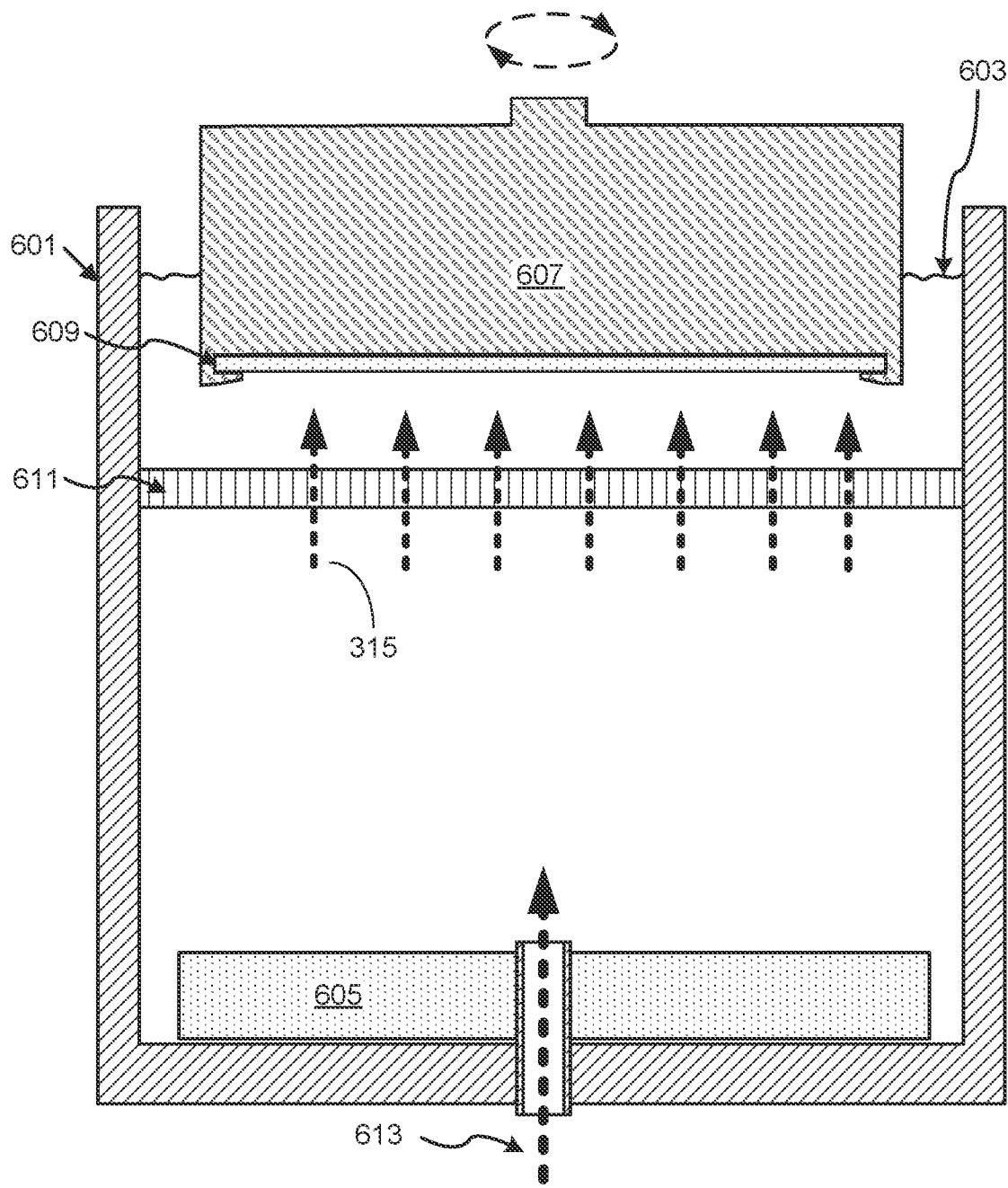
FIG. 6 is a simplified schematic cross-sectional view of an electroplating cell that can be used in electroplating according to embodiments provided herein.

A schematic cross-sectional view of an apparatus that can be used for electrodeposition of a first or second metal in a face-down orientation is shown in FIG. 6. The apparatus includes a plating chamber 601 configured to hold electrolyte 603, and an anode 605. The substrate holder 607 is configured to hold the semiconductor substrate 609 in a face-down orientation and to rotate the substrate 609 during electroplating. The substrate holder 607 further includes electrical contacts that are configured to cathodically (negatively) bias the substrate during electroplating. In the illustrated embodiment the apparatus further includes an ionically resistive ionically permeable element 611 proximate the substrate 609 (e.g., within about 10 mm of the substrate). The ionically resistive ionically permeable element 611 is typically a plate made of a non-conductive material that has a plurality of through-channels or a 3D porous network that allows for flow of electrolyte. The ionically resistive ionically permeable element 611 is often used to improve the uniformity of plating on the semiconductor substrate 609. The plating chamber 601 includes an opening 613 for introduction of electrolyte. In the depicted embodiment, the electrolyte is admitted at the bottom portion of the plating chamber and then flows as depicted by arrows 615 through the channels of the ionically resistive ionically permeable element 611 towards the semiconductor substrate 609. In other embodiments the electrolyte can be injected laterally in a direction that is substantially parallel to the working surface of the semiconductor substrate 609 in addition to, or instead of the flow of electrolyte that is substantially perpendicular to the working surface of the semiconductor substrate 609.

In some embodiments the apparatus further includes an ionically permeable membrane between the anode and a cathodically biased substrate, which separates the plating chamber into an anolyte chamber and a catholyte chamber, where electrolyte in the anolyte chamber and catholyte chamber may have different compositions. For example during electrodeposition of tin silver, the catholyte includes both tin and silver ions, while the anolyte may include only tin ions.

The apparatus in some embodiments further includes a heater and a temperature sensor to maintain the electrolyte at an elevated temperature, e.g., a temperature of at least about 30° C. For example, in some embodiments the apparatus used for electrodeposition of nickel has a heater and is configured for electroplating using a nickel electrolyte at a temperature of at least about 30° C.

In some embodiments the apparatus further includes a controller having program instructions for causing performance any of the method steps described herein.

Figure 7:
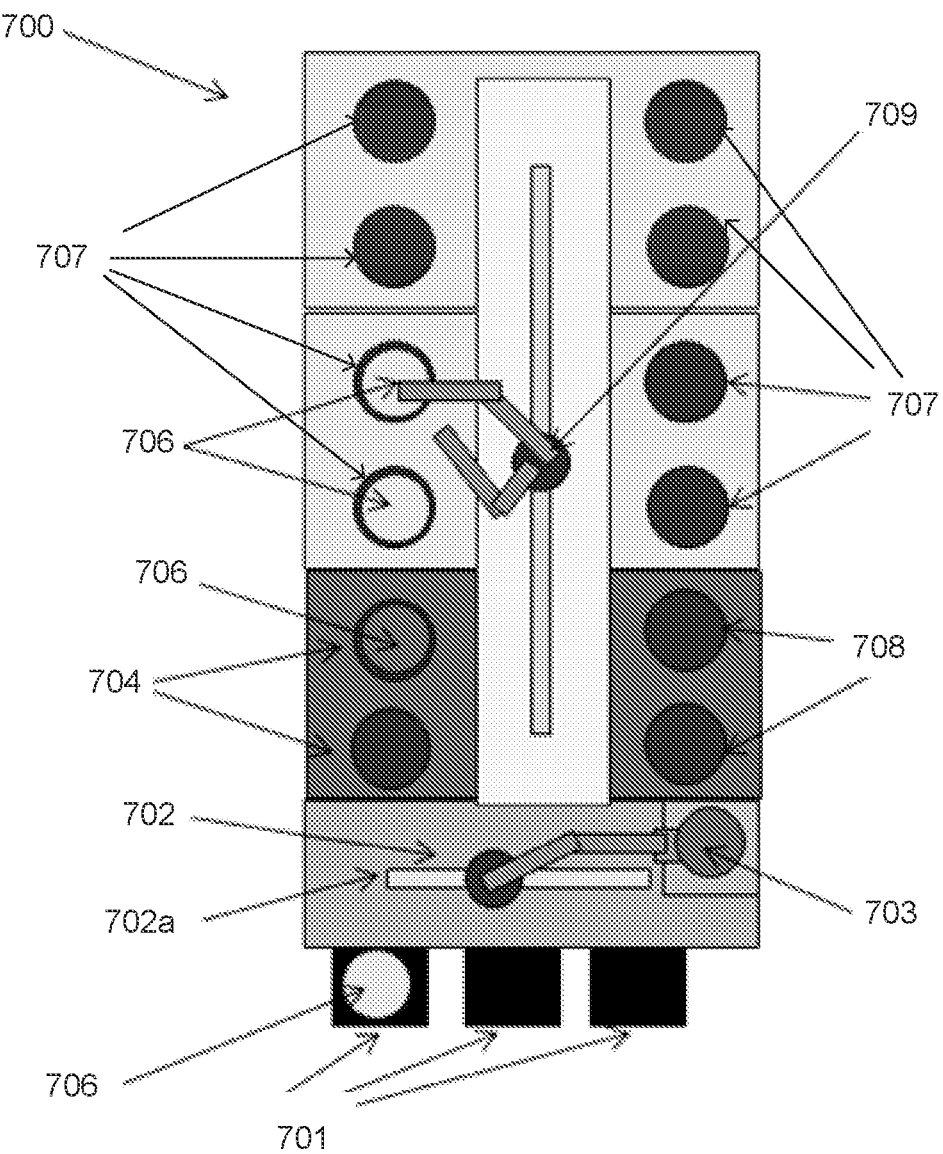
FIG. 7 is a schematic top view of a tool that can be used for electroplating according to embodiments provided herein.

An integrated apparatus configured for electrodeposition of multiple metals is illustrated in FIG. 7. In this embodiment, the apparatus 700 has a set of electroplating cells 707, each containing an electrolyte-containing bath, in a paired or multiple "duet" configuration. In addition to electroplating per se, the apparatus 700 may perform a variety of other electroplating or electroplanarization related processes and sub-steps, such as spin-rinsing, spin-drying, metal and silicon wet etching, electroless deposition, pre-wetting and pre-chemical treating, reducing, annealing, photoresist stripping, and surface pre-activation, for example. The apparatus 700 is shown schematically looking top down in FIG. 7, and only a single level or "floor" is revealed in the figure, but it is to be readily understood by one having ordinary skill in the art that such an apparatus, e.g. the Lam Research Sabre™ 3D tool, can have two or more levels "stacked" on top of each other, each potentially having identical or different types of processing stations. In some embodiments electroplating stations for different metals are arranged on different levels of the tool. In other embodiments a single level may include stations for electroplating both a first and a second metal.

Referring once again to FIG. 7, the substrates 706 that are to be electroplated are generally fed to the apparatus 700 through a front end loading FOUP (front loading unified pod) 701 and, in this example, are brought from the FOUP to the main substrate processing area of the apparatus 700 via a front-end robot 702 that can retract and move a substrate 706 driven by a spindle 703 in multiple dimensions from one station to another of the accessible stations—two front-end accessible stations 704 and also two front-end accessible stations 708 are shown in this example. The front-end accessible stations 704 and 708 may include, for example, pre-treatment stations, and spin rinse drying (SRD) stations. Lateral movement from side-to-side of the front-end robot 702 is accomplished utilizing robot track 702a. Each of the substrates 706 may be held by a cup/cone assembly (not shown) driven by a spindle connected to a motor (not shown), and the motor may be attached to a mounting bracket 709. Also shown in this example are the four "duets" of electroplating cells 707, for a total of eight cells 707. The electroplating cells 707 may be used for electroplating the first and second metals. After a first metal has been electroplated in one of the plating stations 707, the substrate is transferred to a plating cell configured for electroplating of a second metal either on the same level of the apparatus or on a different level of the apparatus 700. A system controller (not shown) may be coupled to the electrodeposition apparatus 700 to control some or all of the properties of the electrodeposition apparatus 700. The system controller may be programmed or otherwise configured to execute instructions according to processes described earlier herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of electrolytes, temperature settings (e.g., heating and/or cooling), voltage delivered to the cathode, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Patterning Method/Apparatus

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or EUV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

What is claimed is:

1. A method of electrodepositing a metal onto a semiconductor substrate having a plurality of through-mask recessed features, the method comprising:
   (a) electrodepositing a first metal into the recessed through-mask features of the semiconductor substrate, without fully filling the recessed through-mask features, in a first electroplating cell using a first lipseal, wherein the first lipseal contacts the semiconductor substrate at a periphery of the semiconductor substrate, and wherein an innermost point of contact between the first lipseal and the semiconductor substrate is located at a first distance from an edge of the semiconductor substrate; and (b) electrodepositing a second metal into the recessed through-mask features of the semiconductor substrate after (a), in a second electroplating cell using a second lipseal, wherein the second lipseal contacts the semiconductor substrate at a periphery of the semiconductor substrate, wherein an innermost point of contact between the second lipseal and the semiconductor substrate is located at a second distance from the edge of the semiconductor substrate, and wherein the second distance is greater than the first distance.

2. The method of claim 1, wherein the second distance is greater than the first distance by about 0.1-0.5 mm.

3. The method of claim 1, wherein the second distance is greater than the first distance by about 0.15-0.25 mm.

4. The method of claim 1, wherein the first lipseal and the second lipseal contact a photoresist material on the semiconductor substrate.

5. The method of claim 1, wherein the first metal is electrodeposited in a plating bath having a temperature of greater than 25° C.

6. The method of claim 1, wherein the first metal is electrodeposited in a plating bath having a temperature of greater than 40° C.

7. The method of claim 1, wherein the first metal is nickel, wherein the nickel is electrodeposited using a plating bath having a temperature of greater than 25° C.

8. The method as claim 1, wherein the first metal is nickel, wherein the nickel is electrodeposited using a plating bath having a temperature of greater than 40° C.

9. The method of claim 1, wherein the first metal is nickel, and the second metal is tin or a combination of tin and silver.

10. The method of claim 1, wherein the first metal is nickel, the second metal is tin or a combination of tin and silver, wherein the method further comprises electrodepositing copper into the recessed through-mask features prior to electrodeposition of nickel.

11. The method of claim 1, wherein electrodeposition in (b) does not result in protrusion of the electrodeposited second metal above a level of a mask material.

12. The method of claim 1, wherein the first lipseal and the second lipseal are different lipseals, wherein the second lipseal has a smaller diameter than the first lipseal.

13. The method of claim 1, wherein the first lipseal and the second lipseal is the same lipseal that is configured to be adjusted to contact the substrate at different positions.

14. The method of claim 1, wherein the semiconductor substrate is a partially fabricated high bandwidth memory (HBM) device.

15. The method of claim 1, further comprising releasing the semiconductor substrate from contact with the first lipseal after (a), and leaving the semiconductor substrate without contact with a lipseal for at least one hour prior to (b).

16. The method of claim 1, further comprising the steps of:
    applying photoresist to the semiconductor substrate;
    exposing the photoresist to light;
    patterning the photoresist and transferring the pattern to the semiconductor substrate;
    and selectively removing the photoresist from the semiconductor substrate.

17. A system for electroplating a metal onto the semiconductor substrate, the system comprising:
    (a) a first electroplating apparatus configured for electrodepositing a first metal onto the semiconductor substrate from a heated electrolyte, the first electroplating apparatus comprising a substrate holder having a first lipseal; and
    (b) a second electroplating apparatus configured for electrodepositing a second metal onto the semiconductor substrate from an unheated electrolyte, the second electroplating apparatus comprising a substrate holder having a second lipseal, wherein the second lipseal has a smaller diameter than the first lipseal.

18. A system for electroplating a metal onto the semiconductor substrate, the system comprising:
    (a) a first electroplating apparatus configured for electrodepositing a first metal onto the semiconductor substrate, the first electroplating apparatus comprising a substrate holder having a first lipseal;
    (b) a second electroplating apparatus configured for electrodepositing a second metal onto the semiconductor substrate, the second electroplating apparatus comprising a substrate holder having a second lipseal, wherein the second lipseal has a smaller diameter than the first lipseal; and
    (c) a controller comprising program instructions configured to cause the steps of:
        i. electroplating the first metal in the first electrplating apparatus to partially fill through-mask recessed features on the semiconductor substrate; and
        ii. electroplating the second metal in the second electroplating apparatus after the first metal has been electroplated.

19. The system of claim 17, wherein a difference between a radius of the first lipseal and a radius of the second lipseal is about 0.15-0.25 mm.

20. The system of claim 17, wherein a difference between a radius of the first lipseal and a radius of the second lipseal is about 0.1-0.5 mm.

\* \* \* \* \*